United States Patent
Ostertag

(10) Patent No.: US 12,453,036 B2
(45) Date of Patent: Oct. 21, 2025

(54) INTEGRATED EQUIPMENT PLATFORM AND METHOD OF USE

(71) Applicant: Next G Solutions, LLC, Kansas City, MO (US)

(72) Inventor: Earl Ostertag, Kansas City, MO (US)

(73) Assignee: Next G Solutions, LLC, Kansas City, MO (US)

(*) Notice: Subject to any disclaimer, the term of this patent is extended or adjusted under 35 U.S.C. 154(b) by 541 days.

(21) Appl. No.: 17/950,648

(22) Filed: Sep. 22, 2022

(65) Prior Publication Data

US 2023/0092154 A1 Mar. 23, 2023

Related U.S. Application Data

(60) Provisional application No. 63/247,135, filed on Sep. 22, 2021.

(51) Int. Cl.
*H04Q 1/02* (2006.01)
*H05K 7/18* (2006.01)

(52) U.S. Cl.
CPC .......... *H05K 7/186* (2013.01); *H04Q 1/025* (2013.01)

(58) Field of Classification Search
CPC .... E04H 1/1238; E04H 1/1205; H04Q 1/025; H04Q 1/09; H05K 7/186
See application file for complete search history.

(56) References Cited

U.S. PATENT DOCUMENTS

| | | | | |
|---|---|---|---|---|
| 3,925,679 A * | 12/1975 | Berman | ................ | E04B 1/3483 290/1 R |
| 5,208,737 A * | 5/1993 | Miller | .................... | H04Q 1/025 174/59 |
| 5,755,062 A * | 5/1998 | Slater | ..................... | H04Q 1/032 52/745.05 |
| 5,781,410 A * | 7/1998 | Keown | .................. | H05K 7/186 174/559 |
| 6,308,477 B1* | 10/2001 | Santamaria | .......... | H05K 5/0247 108/50.02 |
| 7,293,666 B2* | 11/2007 | Mattlin | .................. | H01R 11/01 312/257.1 |
| 8,289,717 B2* | 10/2012 | Heimann | ................. | H04Q 1/10 370/216 |
| 9,095,045 B2* | 7/2015 | Rojo | ........................ | H04Q 1/03 |
| 10,371,411 B2* | 8/2019 | Cursetjee | ................ | F24F 13/32 |
| 2005/0185363 A1* | 8/2005 | Rasmussen | .......... | H05K 7/1491 361/624 |

(Continued)

OTHER PUBLICATIONS

"International Search Report and Written Opinion; PCT/US2022/044398".

*Primary Examiner* — Adriana Figueroa
(74) *Attorney, Agent, or Firm* — AVEK IP, LLC

(57) ABSTRACT

An integrated equipment platform with platform base, corner post, and roof- to support modular equipment rack/cabinets and power distribution and pre-wiring. The platform is designed to be transported fully assembled including equipment cabinets/racks and could also be used to deliver additional required site materials to site in a single shipment to the site to save costs. The integrated equipment platform can be field expanded by installing additional modular cabinets or equipment and or by connecting it to other integrated equipment platform expansion model.

12 Claims, 8 Drawing Sheets

(56) References Cited

U.S. PATENT DOCUMENTS

| | | | |
|---|---|---|---|
| 2008/0060372 A1* | 3/2008 | Hillis | H01L 23/467 |
| | | | 257/E23.099 |
| 2008/0060790 A1* | 3/2008 | Yates | F16F 7/14 |
| | | | 361/679.48 |
| 2009/0229194 A1* | 9/2009 | Armillas | H05K 7/1497 |
| | | | 211/162 |
| 2014/0298734 A1 | 10/2014 | Rogers | |
| 2019/0148819 A1* | 5/2019 | Dominguez | H05K 5/0247 |
| | | | 455/562.1 |
| 2020/0251803 A1* | 8/2020 | Dominguez | E04B 1/3483 |

* cited by examiner

INTEGRATED EQUIPMENT PLATFORM AND METHOD OF USE

CROSS-REFERENCE TO RELATED APPLICATION

This application claims priority in U.S. Provisional Patent Application No. 63/247,135 Filed Sep. 22, 2021, which is incorporated herein by reference.

BACKGROUND OF THE INVENTION

1. Field of the Invention

The present invention relates generally to a platform for equipment and method for use thereof, and more specifically to a fully integrated, modular equipment platform for use in telecommunications and other remote electronics installations.

2. Description of the Related Art

Outdoor telecommunications equipment deployments currently utilize equipment huts with internal equipment components, stand-alone outdoor equipment cabinets mounted on concrete pads, or on anchored equipment plinths, outdoor cabinets mounted on steel platforms with or without canopies/roof that may be pre-assembled off site and transported or built on site. These designs typically require significant work to update/modify existing equipment and require significant skilled trades work and equipment on site to complete the installation. These typical equipment installations may also require additional separately installed support equipment on site, AC power meter and AC distribution box, transport/fiber mux/distribution, transfer switch/generator connection, backup batteries, standby AC or DC generator. These installations require coordination between different skilled trades and could require multiple site visits to complete the installation increasing costs.

Recent trends by U.S. carriers to centralize equipment distribution for initial deployments and equipment upgrades have produced challenges to distribute equipment to installation contractors and may require multiple shipments to the site increasing cost to complete deployment Heretofore there has not been available a system or method for an integrated equipment platform with the advantages and features of the present invention.

BRIEF SUMMARY OF THE INVENTION

The present invention generally provides an integrated equipment platform with platform base, corner post, and roof- to support modular equipment rack/cabinets and power distribution and pre-wiring. The platform is designed to be transported fully assembled including equipment cabinets/racks and could also be used to deliver additional required site materials to site in a single shipment to the site to save costs. The integrated equipment platform can be field expanded by installing additional modular cabinets or equipment and or by connecting it to other integrated equipment platform expansion model.

The platforms provide support and installation locations for varied types of equipment that can be pre-installed, or be updated/reconfigured when needed for equipment upgrades/redesigns. The equipment cabinets are made up of standardized panels that can be installed in multiple configurations. The door panels can be used for right or left door swing, different cooling equipment configurations, heat exchanger, AC or DC Fan, Air Conditioning etc. as is required for the desired equipment. The internal Equipment rack can have equipment pre-installed prior to delivery in the field and be transported to site and installed in the equipment platform, or can allow a existing rack to be changed out minimizing outages and field upgrade work by skilled technicians. By utilizing the platform support structure future cabinet locations can be pre-wired for AC/DC power, grounding, and alarms.

The equipment platform supports equipment install by supporting modular equipment cabinet(s) that can protect the equipment from harmful weather. Equipment support rack, side panels, front/rear door panels and cable ports are used.

The platform design working in conjunction with the modular cabinet and equipment provide advantages over existing standalone platform and cabinets designs. The platform provides the ability to pre-wire equipment cabinet(s) and future cabinet(s) locations prior to the cabinet installs if required. This will significantly reduce the time required to complete the installations in the field. The platform can support the AC power distribution and required connections, equipment grounding, conduit stub up locations, and alarm wiring/bus connections all independent of the modular equipment cabinets. The modular cabinet and various equipment configuration support equipment make the platforms easily adapt to future equipment needs and reduce the overall need for individual products to support equipment deployments. These standard equipment components can also be more easily re-used/redeployed than current outdoor cabinet designs.

This design concept will create a family of related products that work together to create a flexible integrated equipment platform, designed to house electronic equipment, provide weather and temperature control, with standard footprints that can be adapted with minimal field work to meet current future equipment deployment needs. Design will accommodate AC/DC power, EIA equipment racks—19" and 23", battery backup, potential generator deployments, and telecommunications fiber deployments.

BRIEF DESCRIPTION OF THE DRAWINGS

The drawings constitute a part of this specification and include exemplary embodiments of the present invention illustrating various objects and features thereof.

DETAILED DESCRIPTION OF THE PREFERRED EMBODIMENTS

I. Introduction and Environment

As required, detailed aspects of the present invention are disclosed herein, however, it is to be understood that the disclosed aspects are merely exemplary of the invention, which may be embodied in various forms. Therefore, specific structural and functional details disclosed herein are not to be interpreted as limiting, but merely as a basis for the claims and as a representative basis for teaching one skilled in the art how to variously employ the present invention in virtually any appropriately detailed structure.

Certain terminology will be used in the following description for convenience in reference only and will not be limiting. For example, up, down, front, back, right and left refer to the invention as orientated in the view being referred to. The words, "inwardly" and "outwardly" refer to directions toward and away from, respectively, the geometric center of the aspect being described and designated parts thereof. Forwardly and rearwardly are generally in reference to the direction of travel, if appropriate. Said terminology will include the words specifically mentioned, derivatives thereof and words of similar meaning.

II. Preferred Embodiment Integrated Equipment Platform 2

Prior art equipment platform scenarios and outdoor cabinets deployments are installed on-site, requiring cranes or special equipment for delivery, concrete pads or steel platforms, electricians to complete wiring, and other skilled laborers to visit the site to complete the installation. Once deployed, entire cabinets are needed to be replaced to provide equipment upgrades, requiring significant field work to complete.

Figure 1:
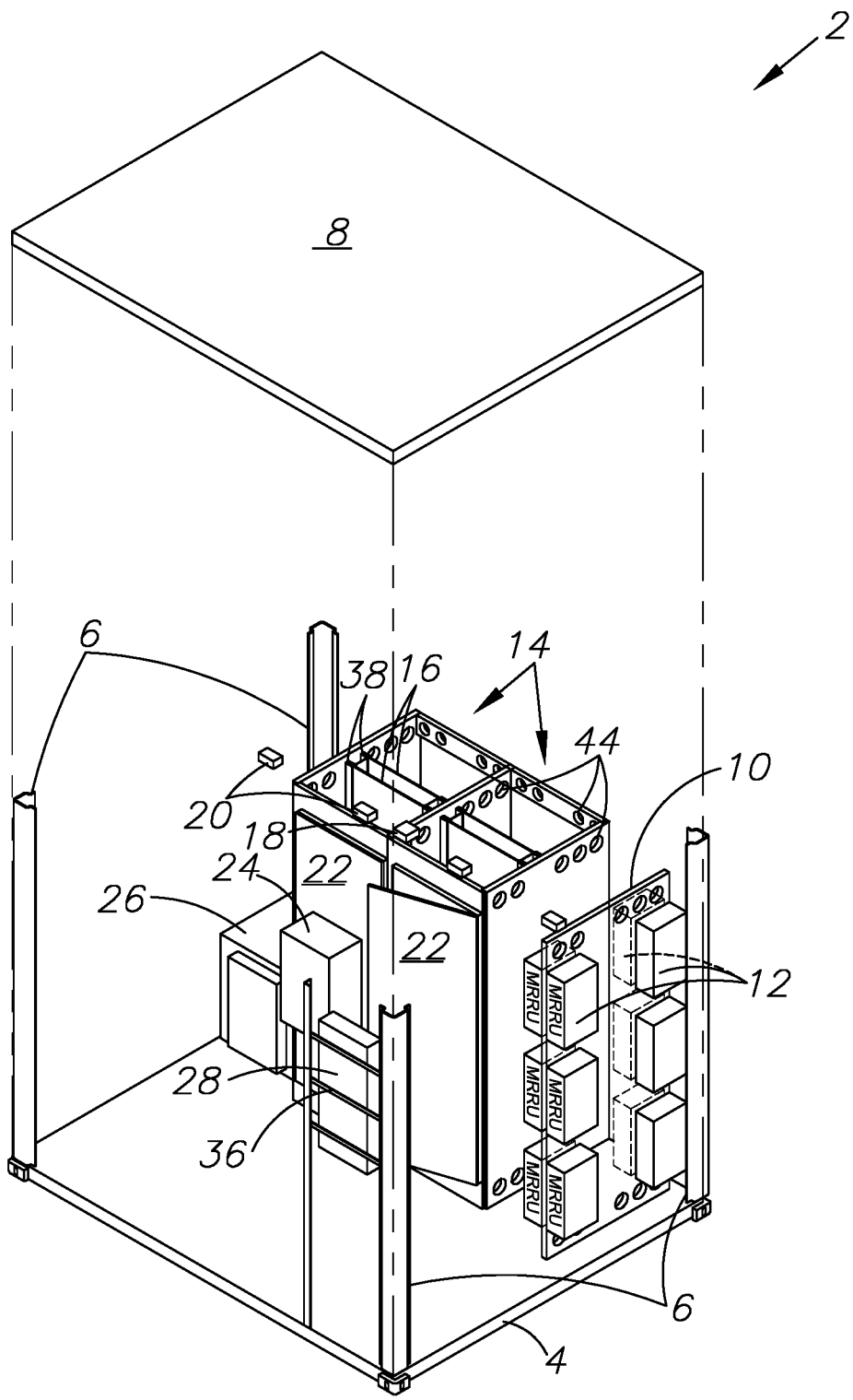
FIG. 1 is a partially-exploded three-dimensional isometric view of a preferred embodiment of the present invention.
Figure 2:
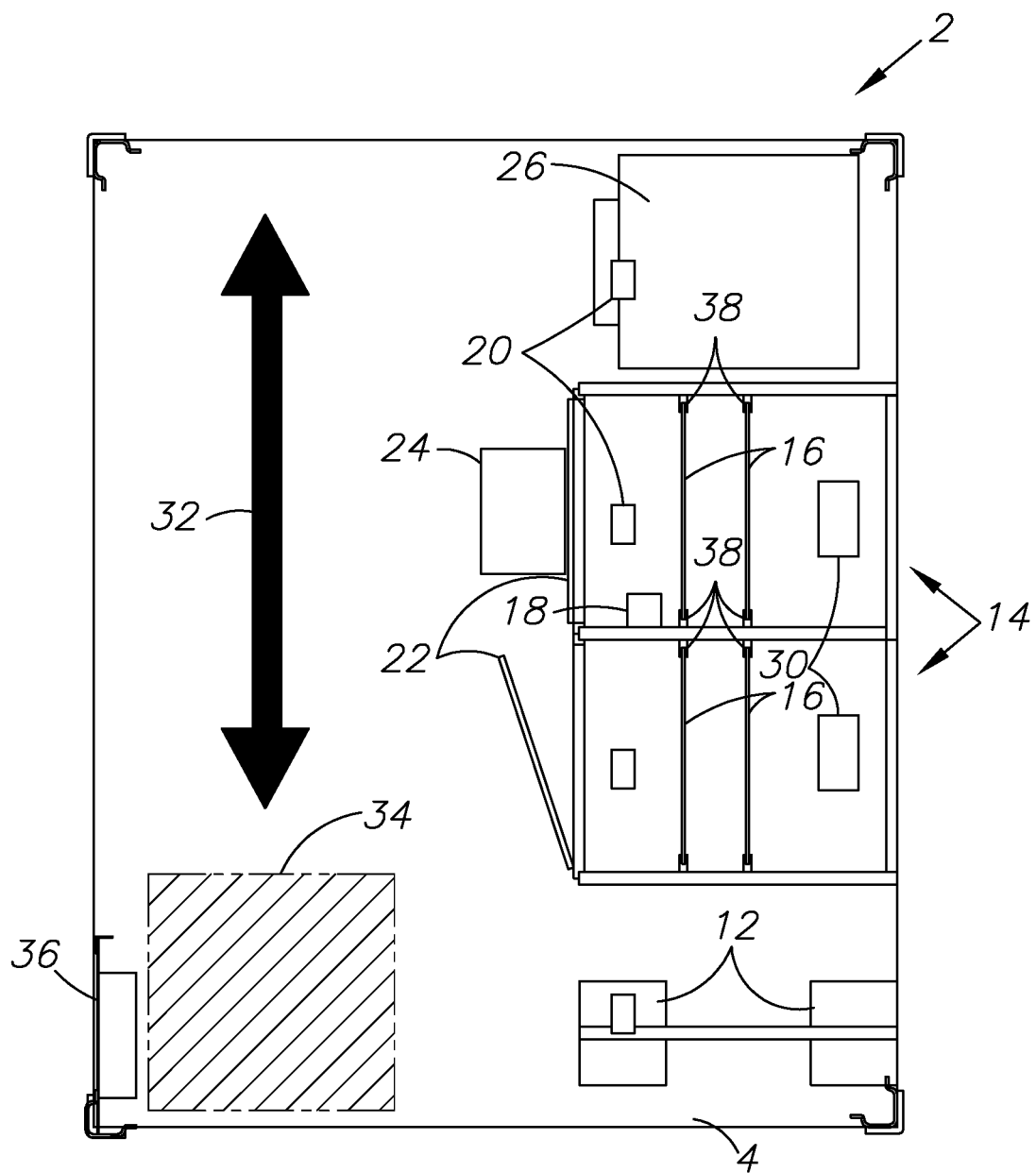
FIG. 2 is a top plan view thereof.

As shown in FIGS. 1-2, the present invention integrated equipment platform 2 includes various modular platform floors 4 and platform roofs 8 joined by corner support posts 6. The roof 8 is prewired to connect to the cabinets 14 and radios 12 or other outdoor equipment secured onto radio support frames 10. Similarly, the floor 4 has access panels 30 which allow fiber and/or grounding connections to be stubbed directly up into the cabinets 14.

An H-frame 36 for hanging an AC distribution panel 28 is shown at one corner of the system 2, with a walkway 32 and required panel access zone 34 allowing easy access to the cabinets 14, support frames 10 and associated equipment, and the AC panel 28.

Each cabinet 14 may have a door 22 and each door can include an air conditioning unit 24 or cooling fan or other heat distribution equipment. AC power outlets 20 for each cabinet 14 may be included with or mounted directly to the roof 8. Similarly, an AC power outlet for a DC power supply feed 18 can be connected in the same manner.

The cabinet 14 is made of the door 22 panel, two side panels, and a rear panel. The rear panel may be bolted in place or replaced with a door panel to flip the access around or to provide rear access to wiring. The side panels are modular and fit with additional cabinet side panels for adding additional equipment cabinets.

The equipment platform layout and cabinet locations operate on a operate on a cold front/hot back principal to maintain proper cooling airflow for adjacent equipment and expansion platform locations. The cold air is delivered at the front of the cabinets 14 via the door 22, while hot air is pushed towards the back of the cabinets where connections are made. This prevents cabinets from affecting the cooling of neighboring units.

Equipment racks 16 containing rack posts 38 can be mounted directly into each cabinet 14. These racks can be pre-installed as part of the entire assembly or may be installed on-site once other equipment has been installed.

A battery backup cabinet 26 can also be included and mounted to the system 2.

Figure 3:
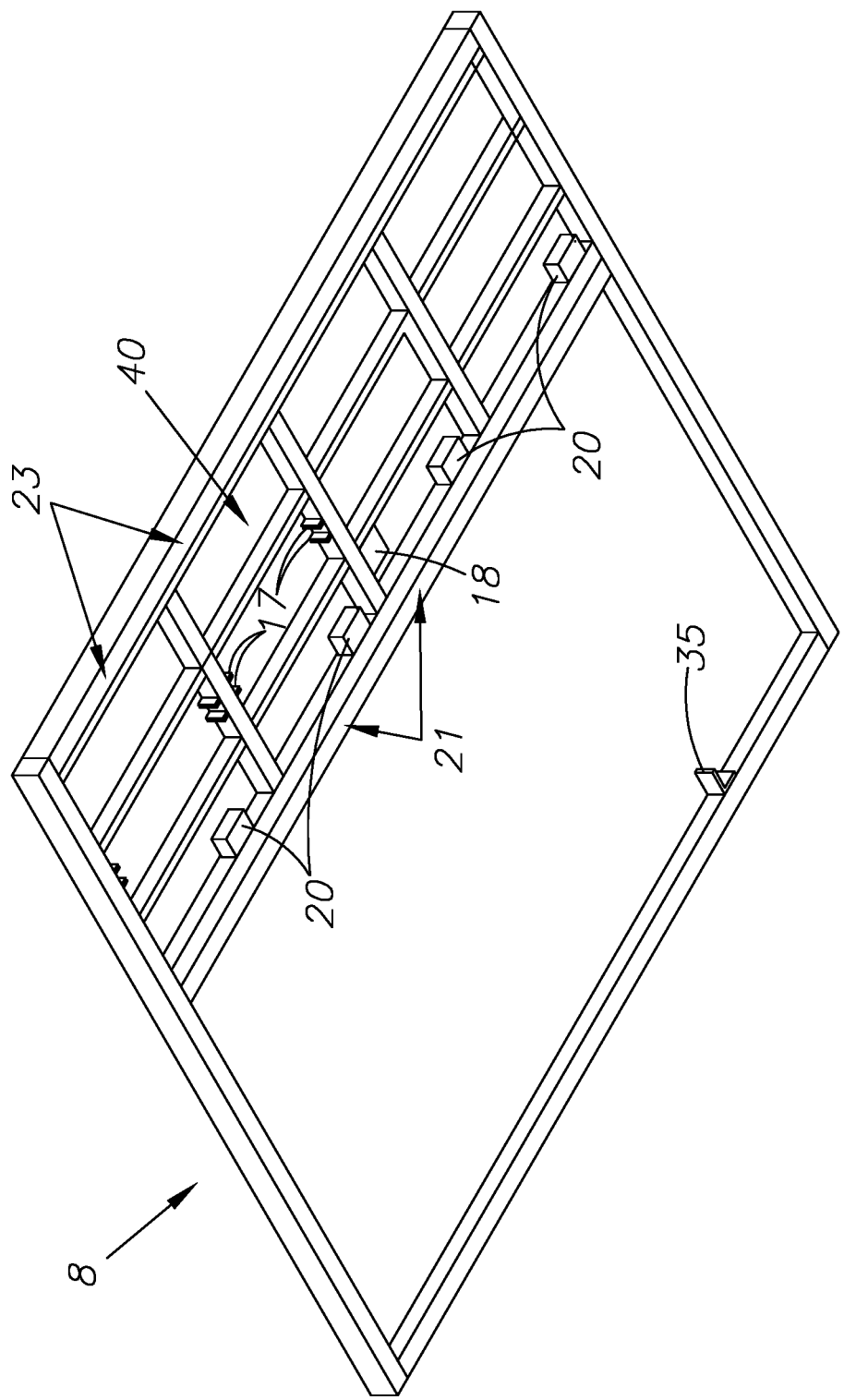
FIG. 3 is a three-dimensional isometric view of the bottom side of a roof element thereof.

FIG. 3 shows the underside view of platform roof 8 with prewired cable pathways 40 and equipment platform support/mounting members 17, 21, 23, and 35. The roof may also include mounting elements, such as an AC panel mounting rack connection 35, equipment rack mounting connections 17, as well as front 21 and rear 23 support mounting locations for the cabinets 14 and cabinet doors 22.

Figure 4:
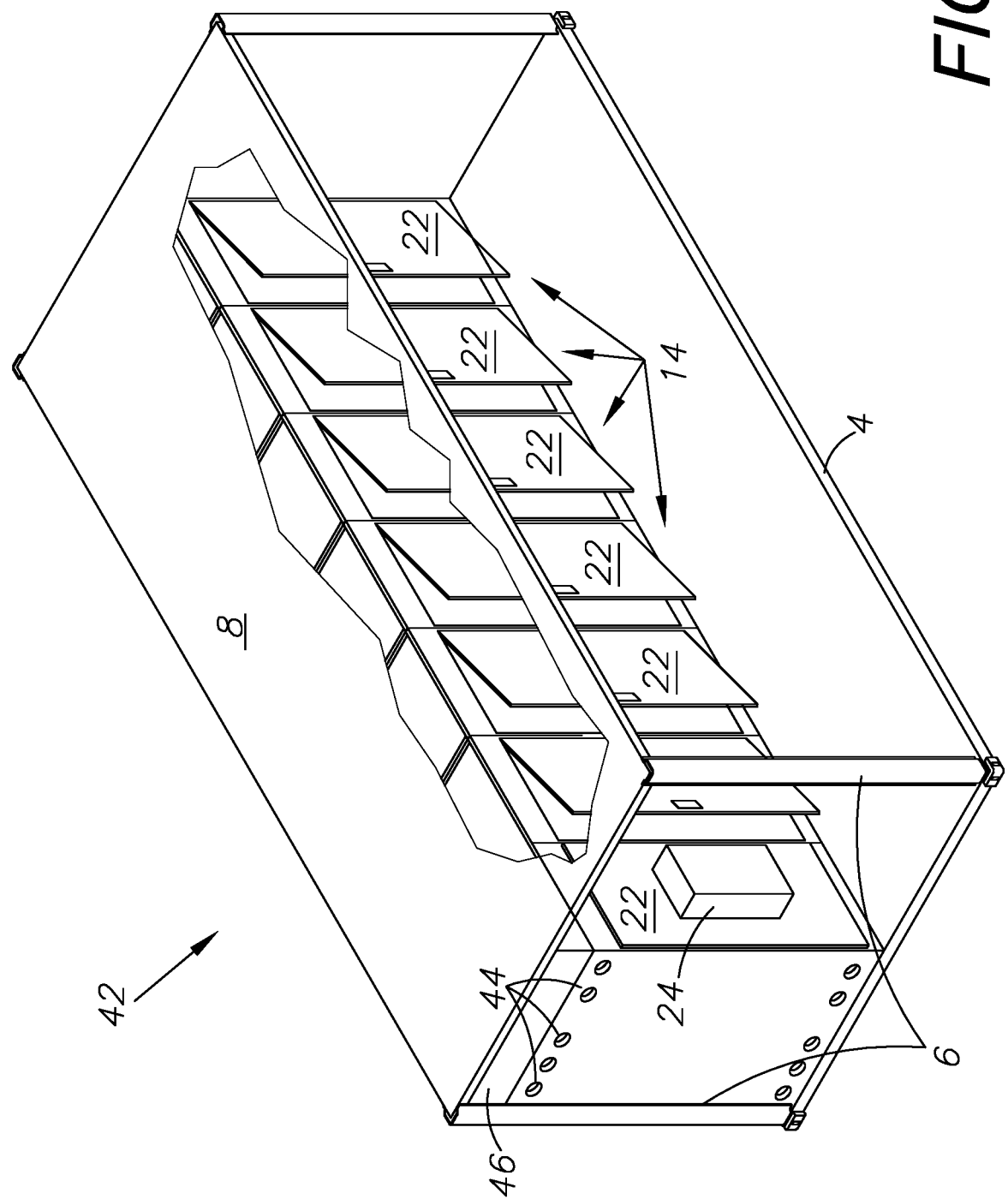
FIG. 4 is a three-dimensional isometric view of a first modular element thereof.
Figure 5:
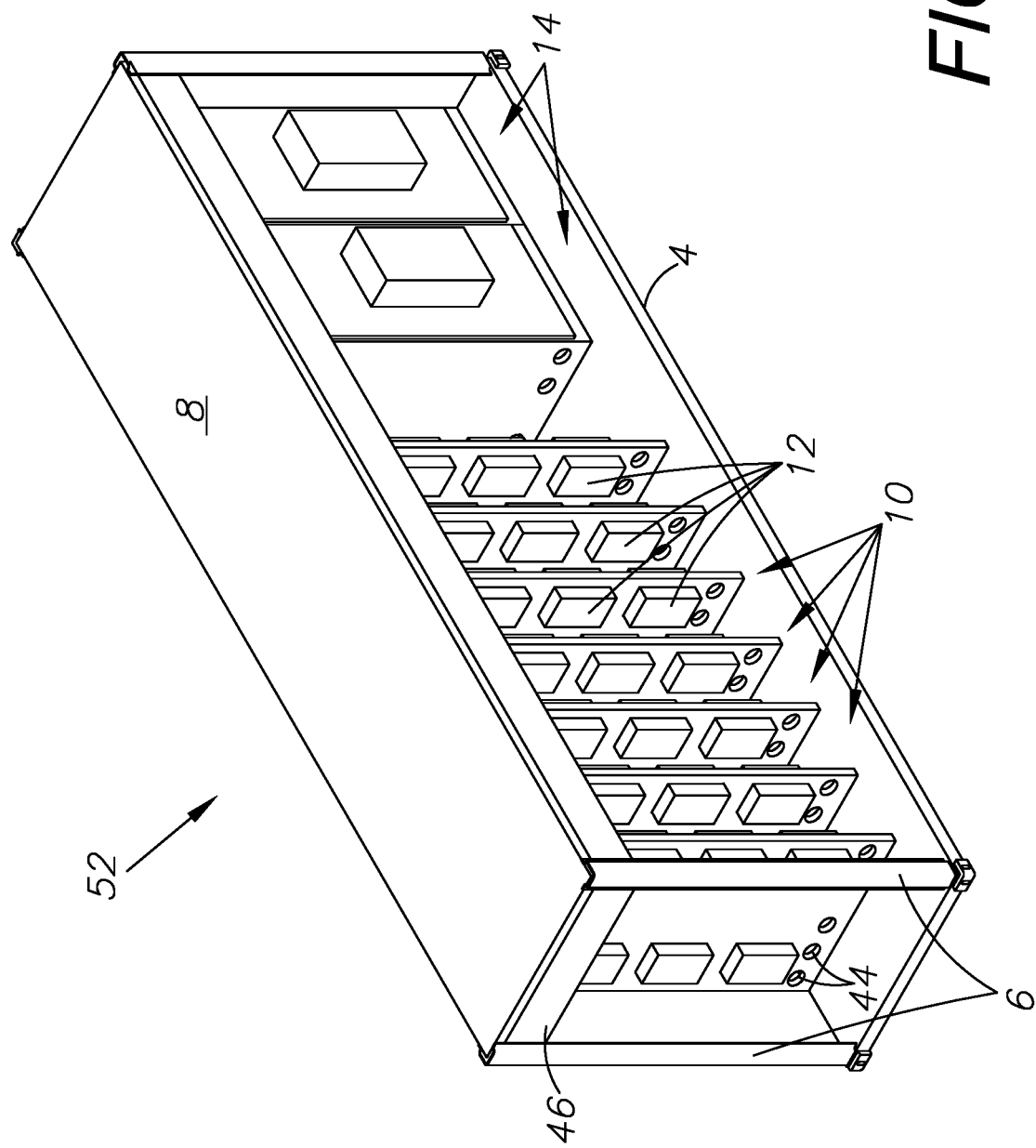
FIG. 5 is a three-dimensional isometric view of a second modular element thereof.
Figure 6:
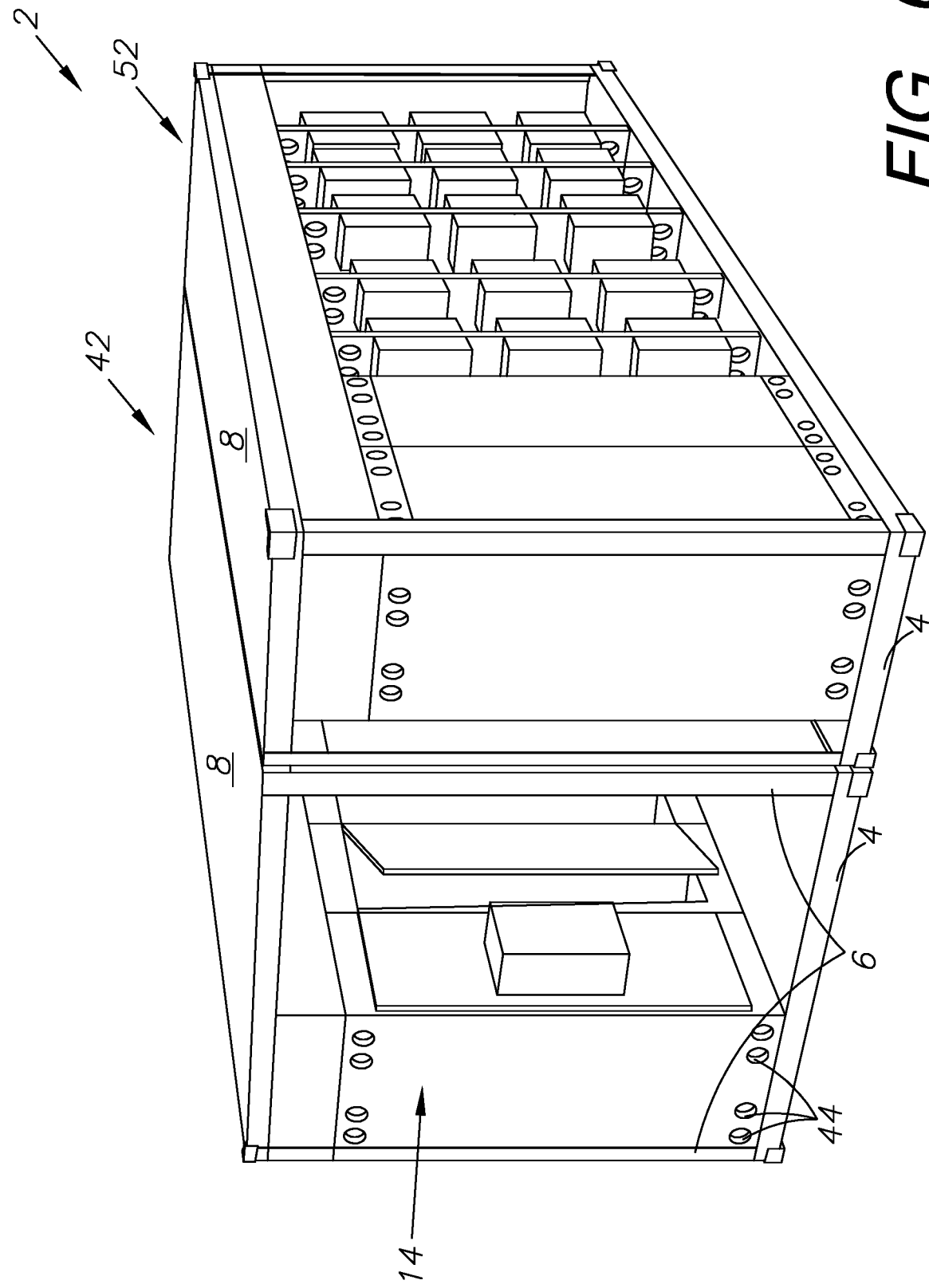
FIG. 6 is a three-dimensional perspective view of the elements of FIGS. 4 and 5 shown joined.

FIGS. 4 and 5 show modular extended platforms 42 and extended platform expansions 52 which can be joined together and quickly wired up as desired. Cabinets 14 may be connected to the extended platforms 42, and equipment racks 10 and additional cabinets 14 may be connected to the extended platform expansions 52. FIG. 6 shows how these two extended platforms and extended platform expansions can join together to form a modular integrated equipment platform 2. These figures also show an expanded cable management assembly 46 above the cabinet locations to accommodate more dense cable connections to the multiple cabinets. This expanded cable management assembly 46 can contain additional wiring and other connections that can directly connect to the equipment inside the cabinet 14 or to the outdoor equipment 12, and which is attached to the prewired roof panel 8. Cable ports 44 are shown throughout, allowing quick wiring between cabinets and other equipment. Note that the sizes of the cabinets 14 do not change with the use of the expanded cable management assembly 46; only the corner posts 6 are required to have additional length.

Figure 7:
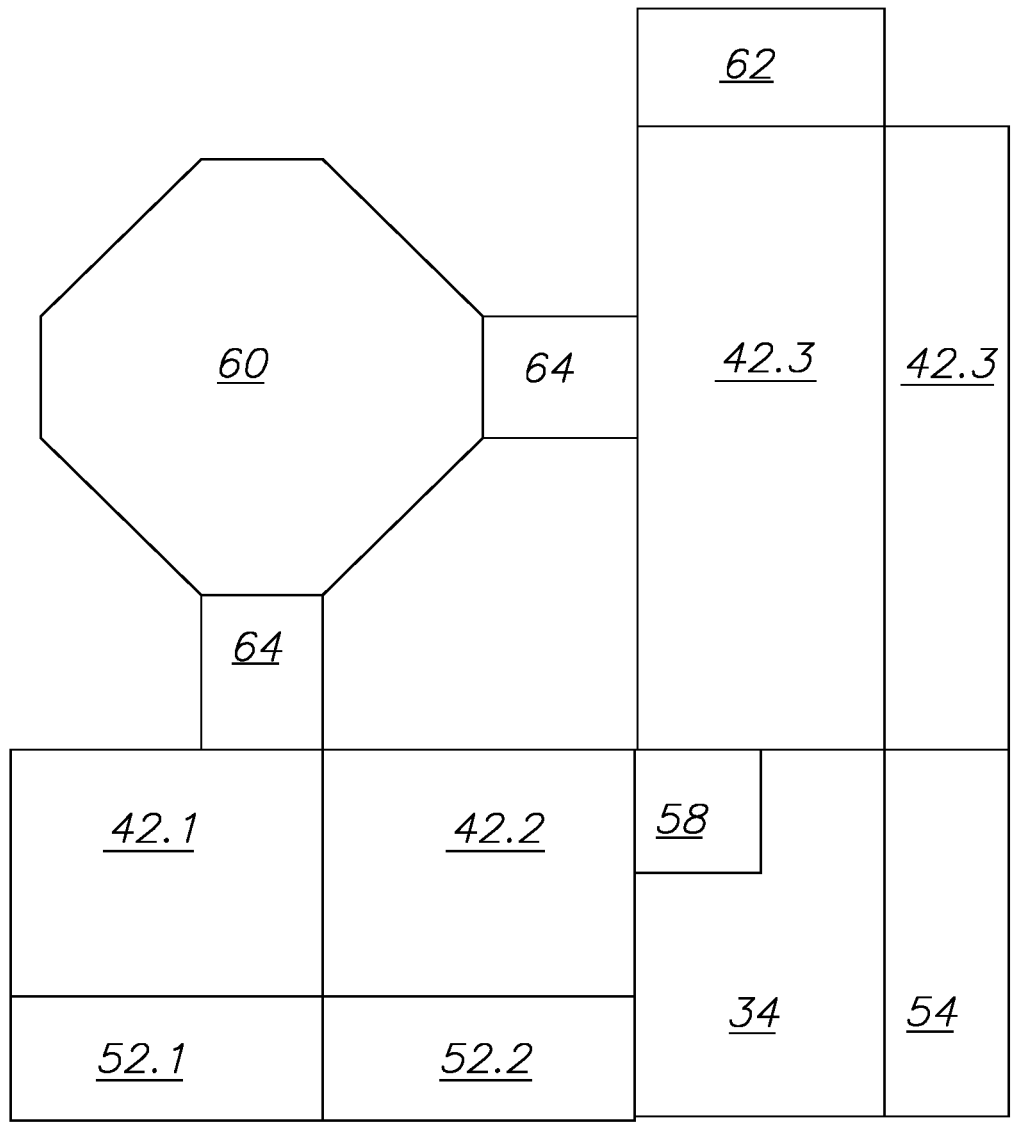
FIG. 7 is a plan view of an example orientation utilizing embodiments of the present invention.
Figure 8:
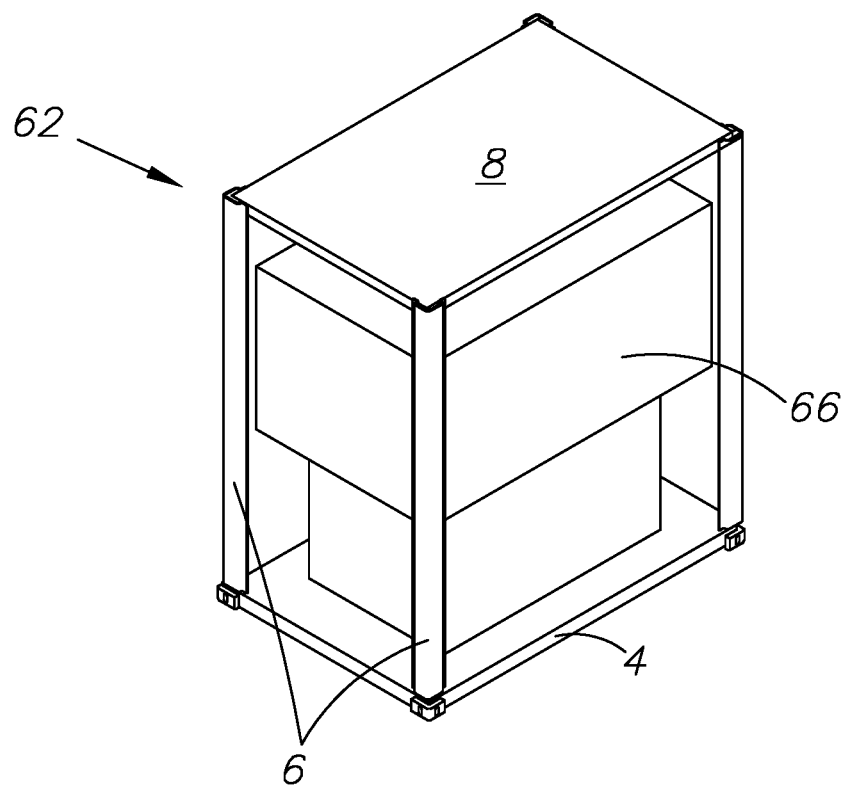
FIG. 8 is a three-dimensional isometric view of a backup generator element thereof.

FIG. 7 shows a plan view how multiple such extended platforms and extended platform expansions can be joined together to form larger on-site assemblies. Here, a cellular tower 60 is connected to various platforms via ice bridges 64. Each bridge may include an upper bridge and a lower bridge for connections to the extended platforms 42 and the extended platform expansions 52 respectively. The particular example shown in FIG. 7 includes a pair of integrated equipment platforms 42.1, 42.2 connected to a respective pair of expansion equipment platforms 52.1, 52.2. An AC power distribution panel 54 is shown, as well as a backhaul fiber distribution cabinet 58. On the other side are an additional extended platform 42.3 and extended expansion platform 52.3 which are longer than the integrated equipment platforms 42.1, 42.2 and expansion equipment platforms 52.1, 52.2.

Also shown in FIG. 7 is a portable generator module 62 on an expansion platform. A backup generator 66 can be transported to the site and connected quickly to the rest of the assembly to provide backup power in the case of an outage or emergency. The modular platform with backup generator 66 can be transported to the site as required for emergency backup or for permanent installation on the site. Due to the modular design, generators can be redeployed to sites as required. Each cellular tower 60 can be delivered its own backup generator on a need basis or these can be permanently affixed.

The joining of the integrated equipment platforms 42 with the extended platform expansions 52 forms the necessary technician access spaces including walkways 32 which allow easy access to the stored equipment. Additional modules may be added as needed. Modules can be pre-assembled off-site or may be assembled completely on site. Due to the nature of the system 2, equipment can be easily swapped in and out without requiring an entire team of professionals to disassemble and rewire equipment.

The technician access spaces 32 can be used to store other equipment needed on-site when the entire system 2 is shipped. For example, radios, antennas, and other necessary on-site equipment for the tower could simply be bundled together and strapped to this space when the equipment platform system 2 is being shipped over the road. This alleviates the need for a second delivery to the site which may not be timely coordinated.

For transportation and storage of the entire equipment platform, the roof 8, floor 4, AC panel 28, H-frame 36, and corner posts 6 can be flat-packed between the roof and floor. This allows the equipment platform to be shipped with minimal space. Multiple can be stacked to reduce shipping costs. The equipment platform can be assembled on site or in a factory location.

In typical prior-art cases, if new equipment is to be added or exchanged, the entire outdoor cabinet assembly would have to be removed, replaced, and rebuilt. Here, the equipment platform roof and floor assemblies remain in place, and the modular cabinet 14 and/or equipment rack 10 can be updated or configured as required without requiring rework to the power distribution and additional cabling. The old components are easily reused and redeployed.

The structures of the roof, floor, and corner posts also allow and support legacy cabinets and equipment for existing site modifications. The present invention can be wired into an existing assembly and placed adjacent to it, or can be used to replace current equipment while reserving and reusing equipment that may already be onsite.

Wire mesh security panels may be attached to the integrated equipment platform to improve equipment security. Tarps may also be attached to provide protection from inclement weather.

It is to be understood that while certain embodiments and/or aspects of the invention have been shown and described, the invention is not limited thereto and encompasses various other embodiments and aspects.

Having thus described the invention, what is claimed as new and desired to be secured by Letters Patent is:

1. A modular integrated equipment platform comprising:
    platform floor, a platform roof, and a plurality of corner posts joining said platform floor and said platform roof such that said platform roof is raised above said platform floor, producing an interior space between said platform floor and said platform roof and thereby forming an integrated equipment platform;
    said platform roof comprising at least one prewired channel, at least one equipment cabinet connection mount, at least one equipment rack connection mount, and at least one AC power connection;
    at least one modular equipment cabinet removably installed within said interior space between said platform floor and said platform roof, said at least one equipment cabinet comprising a modular door panel having a door, a pair of modular side panels, and a modular rear panel;
    at least one equipment rack installed within said at least one modular equipment cabinet onto an equipment rack post, said at least one equipment rack configured to be connected into said platform roof;
    a floor access panel within said platform floor configured to be located within said at least one equipment rack;
    a modular support frame configured to house outdoor equipment installed within said interior space between said platform floor and said platform roof, said outdoor equipment configured to be connected into said platform roof;
    an AC distribution panel connected to an H-frame mounting rack within said interior space between said platform floor and said platform roof;
    a defined technician access space including a walkway located between said at least one equipment cabinet, said support frame, and said H-frame; and
    wherein said platform floor, said platform roof, and said plurality of corner posts provide a semi-permanent structure upon which said at least one modular equipment cabinet can be selectively removed, selectively moved, selectively redeployed, and selectively replaced within without removing said platform floor, said platform roof, or any one of said plurality of corner posts.

2. The system of claim 1, further comprising:
    a second platform floor, a second platform roof, and an additional plurality of corner posts joining said second platform floor and said second platform roof thereby forming a modular extension platform; and
    said modular extension platform configured to be selectively joined to said integrated equipment platform wherein said modular extension platform and said integrated equipment platform share power and communication connections.

3. The system of claim 1, further comprising:
    an expanded cable management assembly placed below said platform roof; and
    said expanded cable management assembly configured to provide wiring and cable management for said at least one equipment cabinet and said outdoor equipment.

4. The system of claim 1, wherein said platform roof, said platform floor, said plurality of corner posts, said H-frame, and said AC distribution panel can be flat packed and shipped for assembly.

5. The system of claim 4, wherein said assembly occurs on site.

6. The system of claim 4, wherein said assembly occurs at a factory.

7. The system of claim 4, wherein antennas, radios, hybrid cables, and additional equipment for use at a site is packaged and strapped within said technician access space of said platform floor.

8. The system of claim 1, further comprising:
    a backup generator assembly installed within an expansion platform having an expansion platform floor, an expansion platform roof, and at least one expansion platform support;
    said expansion platform configured to be placed adjacent to said modular integrated platform such that said expansion platform floor is adjacent to said platform floor and said expansion platform roof is adjacent to said platform roof; and
    wherein said backup generator is configured for powering said AC distribution panel.

9. The system of claim 1, further comprising a removable cooling unit connected to said door.

10. The system of claim 9, wherein said cooling unit comprises an air conditioner.

11. The system of claim 1, further comprising at least one protective covering placed temporarily over at least a portion of the integrated equipment platform, said at least one protective covering being affixed to said platform roof.

12. The system of claim 11, wherein said protective covering is selected from the list of protective coverings comprising: a mesh security panel; and a tarp.

* * * * *